(12) United States Patent
Herman et al.

(10) Patent No.: US 10,024,899 B2
(45) Date of Patent: Jul. 17, 2018

(54) METHOD AND APPARATUS FOR DETECTING AN ENERGIZED E-FIELD

(71) Applicant: WHIRLPOOL CORPORATION, Benton Harbor, MI (US)

(72) Inventors: Mark L. Herman, Saint Joseph, MI (US); Garry L. Peterman, Stevensville, MI (US); Daniel M. Putnam, Holland, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 33 days.

(21) Appl. No.: 15/444,995

(22) Filed: Feb. 28, 2017

(65) Prior Publication Data

US 2017/0168102 A1  Jun. 15, 2017

Related U.S. Application Data

(63) Continuation of application No. 14/055,195, filed on Oct. 16, 2013, now Pat. No. 9,645,182.

(51) Int. Cl.

| | |
|---|---|
| *H05B 11/00* | (2006.01) |
| *G01R 29/08* | (2006.01) |
| *G01R 29/12* | (2006.01) |
| *H05B 6/62* | (2006.01) |
| *G08B 21/18* | (2006.01) |
| *G08B 7/06* | (2006.01) |

(Continued)

(52) U.S. Cl.
CPC ....... *G01R 29/0857* (2013.01); *D06F 58/266* (2013.01); *G01R 29/12* (2013.01); *G08B 7/06* (2013.01); *G08B 21/18* (2013.01); *H05B 6/62* (2013.01); *D06F 58/02* (2013.01); *G01Q 10/00* (2013.01); *G01R 1/00* (2013.01); *G05F 1/00* (2013.01)

(58) Field of Classification Search
CPC .............. G01Q 10/00; G01R 1/00; G05F 1/00
See application file for complete search history.

(56) References Cited

U.S. PATENT DOCUMENTS

| | | |
|---|---|---|
| 1,503,224 A | 7/1924 | Blaine |
| 1,871,269 A | 8/1932 | Hobrock |

(Continued)

FOREIGN PATENT DOCUMENTS

| | | |
|---|---|---|
| EP | 0269358 A2 | 6/1988 |
| EP | 1753265 A1 | 2/2007 |

(Continued)

OTHER PUBLICATIONS

European Search Report for Corresponding EP14175081.0, dated Dec. 4, 2014.

(Continued)

*Primary Examiner* — Jermele M Hollington
*Assistant Examiner* — Temilade Rhodes-Vivour

(57) ABSTRACT

A method for detecting the presence of an energized e-field in a space, wherein the space includes at least one electrically conductive element disposed in the space and coupled with a controller, the method including receiving in the controller a signal from the at least one electrically conductive element, determining that an energized e-field occupies the space, and sending a signal from the controller indicative of the presence of the energized e-field in the space.

20 Claims, 6 Drawing Sheets

(51) Int. Cl.
  *D06F 58/26*   (2006.01)
  *D06F 58/02*   (2006.01)
  *G05F 1/00*   (2006.01)
  *G01Q 10/00*   (2010.01)
  *G01R 1/00*   (2006.01)

(56) References Cited

U.S. PATENT DOCUMENTS

| | | |
|---|---|---|
| 2,112,418 A | 3/1938 | Hart, Jr. et al. |
| 2,212,522 A | 8/1940 | Hart, Jr. et al. |
| 2,228,136 A | 1/1941 | Hart, Jr. |
| 2,276,996 A | 3/1942 | Milinowski |
| 2,511,839 A | 6/1950 | Frye |
| 2,542,589 A | 2/1951 | Stanton et al. |
| 2,656,839 A | 10/1953 | Howard |
| 2,740,756 A | 4/1956 | Thomas |
| 2,773,162 A | 12/1956 | Christensen |
| 3,161,480 A | 12/1964 | Birch-Iensen et al. |
| 3,184,637 A | 5/1965 | Skinner |
| 3,316,380 A | 4/1967 | Pansing |
| 3,355,812 A | 12/1967 | Bennett |
| 3,426,439 A | 2/1969 | Ryman et al. |
| 3,439,431 A | 4/1969 | Heidtmann |
| 3,537,185 A | 11/1970 | Ingram |
| 3,543,408 A | 12/1970 | Candor et al. |
| 3,601,571 A | 8/1971 | Curico |
| 3,652,816 A | 3/1972 | Preston |
| 3,701,875 A | 10/1972 | Witsey et al. |
| 3,754,336 A | 8/1973 | Feild |
| 3,878,619 A | 4/1975 | Hodgett et al. |
| 4,014,732 A | 3/1977 | Beckert et al. |
| 4,028,518 A | 6/1977 | Bourdouris et al. |
| 4,119,826 A | 10/1978 | Chambley et al. |
| 4,197,851 A | 4/1980 | Fellus |
| 4,296,298 A | 10/1981 | MacMaster et al. |
| 4,296,299 A | 10/1981 | Stottmann et al. |
| 4,365,622 A | 12/1982 | Harrison |
| 4,409,541 A | 10/1983 | Richards |
| 4,523,387 A | 6/1985 | Mahan |
| 4,529,855 A | 7/1985 | Fleck |
| 4,638,571 A | 1/1987 | Cook |
| 5,152,075 A | 10/1992 | Bonar |
| 5,495,250 A | 2/1996 | Ghaem et al. |
| 5,838,111 A | 11/1998 | Hayashi et al. |
| 5,983,520 A | 11/1999 | Kim et al. |
| 6,124,584 A | 9/2000 | Blaker et al. |
| 6,531,880 B1 * | 3/2003 | Schneider ............ G01R 31/021 |
| | | 324/539 |
| 6,812,445 B2 | 11/2004 | Gorbold |
| 7,619,403 B2 | 11/2009 | Kashida |
| 7,676,953 B2 * | 3/2010 | Magill ................ G01N 27/223 |
| | | 144/380 |
| 7,883,609 B2 | 2/2011 | Petrenko et al. |
| 8,499,472 B2 | 8/2013 | Bari et al. |
| 8,826,561 B2 * | 9/2014 | Wisherd ................ D06F 58/26 |
| | | 34/255 |
| 8,839,527 B2 | 9/2014 | Ben-Shmuel et al. |
| 8,943,705 B2 | 2/2015 | Wisherd et al. |
| 9,127,400 B2 | 9/2015 | Herman et al. |
| 9,173,253 B2 * | 10/2015 | Wohl ........................ H05B 6/62 |
| 9,194,625 B2 | 11/2015 | Herman et al. |
| 9,200,402 B2 | 12/2015 | Wisherd et al. |
| 9,447,537 B2 | 9/2016 | Wisherd et al. |
| 2002/0047009 A1 * | 4/2002 | Flugstad .................. A23B 4/01 |
| | | 219/771 |
| 2004/0149734 A1 | 8/2004 | Petrenko et al. |
| 2005/0286914 A1 | 12/2005 | Nagahama |
| 2006/0097726 A1 * | 5/2006 | Frederick ................. F21S 4/10 |
| | | 324/414 |
| 2006/0289526 A1 | 12/2006 | Takizaki et al. |
| 2007/0045307 A1 | 3/2007 | Tsui et al. |
| 2009/0172965 A1 | 7/2009 | Campagnolo et al. |
| 2009/0195255 A1 | 8/2009 | Kalokitis et al. |
| 2010/0115785 A1 | 5/2010 | Ben-Shmuel et al. |
| 2011/0308101 A1 | 12/2011 | Wisherd et al. |
| 2012/0164022 A1 | 6/2012 | Muginstein et al. |
| 2012/0247800 A1 | 10/2012 | Shah et al. |
| 2012/0291304 A1 | 11/2012 | Wisherd et al. |
| 2013/0119055 A1 | 5/2013 | Wohl et al. |
| 2013/0207674 A1 | 8/2013 | Hahl et al. |
| 2013/0271811 A1 | 10/2013 | Lam et al. |
| 2014/0325865 A1 | 11/2014 | Wisherd et al. |
| 2015/0020403 A1 | 1/2015 | Herman et al. |
| 2015/0089829 A1 | 4/2015 | Herman et al. |
| 2015/0101207 A1 | 4/2015 | Herman et al. |
| 2015/0102801 A1 | 4/2015 | Herman et al. |
| 2015/0159949 A1 | 6/2015 | Herman et al. |

FOREIGN PATENT DOCUMENTS

| | | |
|---|---|---|
| EP | 2827087 A1 | 1/2015 |
| EP | 2840340 A2 | 2/2015 |
| GB | 601855 A | 5/1948 |
| GB | 1255292 A | 12/1971 |
| GB | 2019543 A | 10/1979 |
| JP | 4307095 A | 10/1992 |
| WO | 2009106906 A1 | 9/2009 |
| WO | 2012001523 A2 | 1/2012 |

OTHER PUBLICATIONS

European Search Report for Corresponding EP141785683., dated Feb. 16, 2015.
"British Help American Wounded: Rehabilitation and Treatment, UK, 1944", Ministry of Information Second World War Official.
European Search Report for Corresponding EP14179021.2, dated Feb. 3, 2015.
European Search Report for Counterpart EP16155782.2, dated Jul. 28, 2016.

* cited by examiner

METHOD AND APPARATUS FOR DETECTING AN ENERGIZED E-FIELD

CROSS-REFERENCE TO RELATED APPLICATION

This application is a continuation of U.S. patent application Ser. No. 14/055,195, filed Oct. 16, 2013, now U.S. Pat. No. 9,645,182, issued May 9, 2017 which is incorporated herein by reference in its entirety.

BACKGROUND OF THE INVENTION

Dielectric heating is the process in which a high-frequency alternating electric field heats a dielectric material, such as water molecules. At higher frequencies, this heating is caused by molecular dipole rotation within the dielectric material, while at lower frequencies in conductive fluids, other mechanisms such as ion-drag are more important in generating thermal energy.

Microwave frequencies are typically applied for cooking food items and are considered undesirable for drying laundry articles because of the possible temporary runaway thermal effects random application of the waves in a traditional microwave. Radio frequencies and their corresponding controlled and contained e-field are typically used for drying of textile material.

When applying an RF electronic field (e-field) to a wet article, such as a clothing material, the e-field may cause the water molecules within the e-field to dielectrically heat, generating thermal energy which effects the rapid drying of the articles.

Errant e-fields, however, may be harmful to both a user and electronics. An RF e-field applied to human skin may cause similar dielectric heating, generating thermal energy which may burn a user. Additionally, an RF e-field applied to unshielded electronics, sensors, or wires may generate electronic signal interference, and may potentially damage the electronics.

BRIEF DESCRIPTION OF THE INVENTION

One aspect of the invention is directed to a method for detecting a presence of an energized e-field in a space for heating an article, wherein the space includes an article to be heated and at least one electrically conductive element configured to produce a voltage or current in reaction to an energized e-field in the space and coupled with a controller. The method includes, if the at least one electrically conductive element produces a voltage or current in reaction to the e-field apart from the article, receiving in the controller a signal from the at least one electrically conductive element indicative of a value of a parameter associated with voltage or current flow in the at least one electrically conductive element, determining that the energized e-field occupies the space based on the received signal, and sending a signal from the controller indicative of the presence of the energized e-field in the space.

DESCRIPTION OF EMBODIMENTS OF THE INVENTION

While this description may be primarily directed toward an e-field detection apparatus for detecting the presence of an energized radio frequency (RF) e-field in a RF laundry drying machine, the invention may be applicable in any environment using a RF signal application. Thus, a brief summary of the contemplated environment should aid in a more complete understanding.

Figure 1:
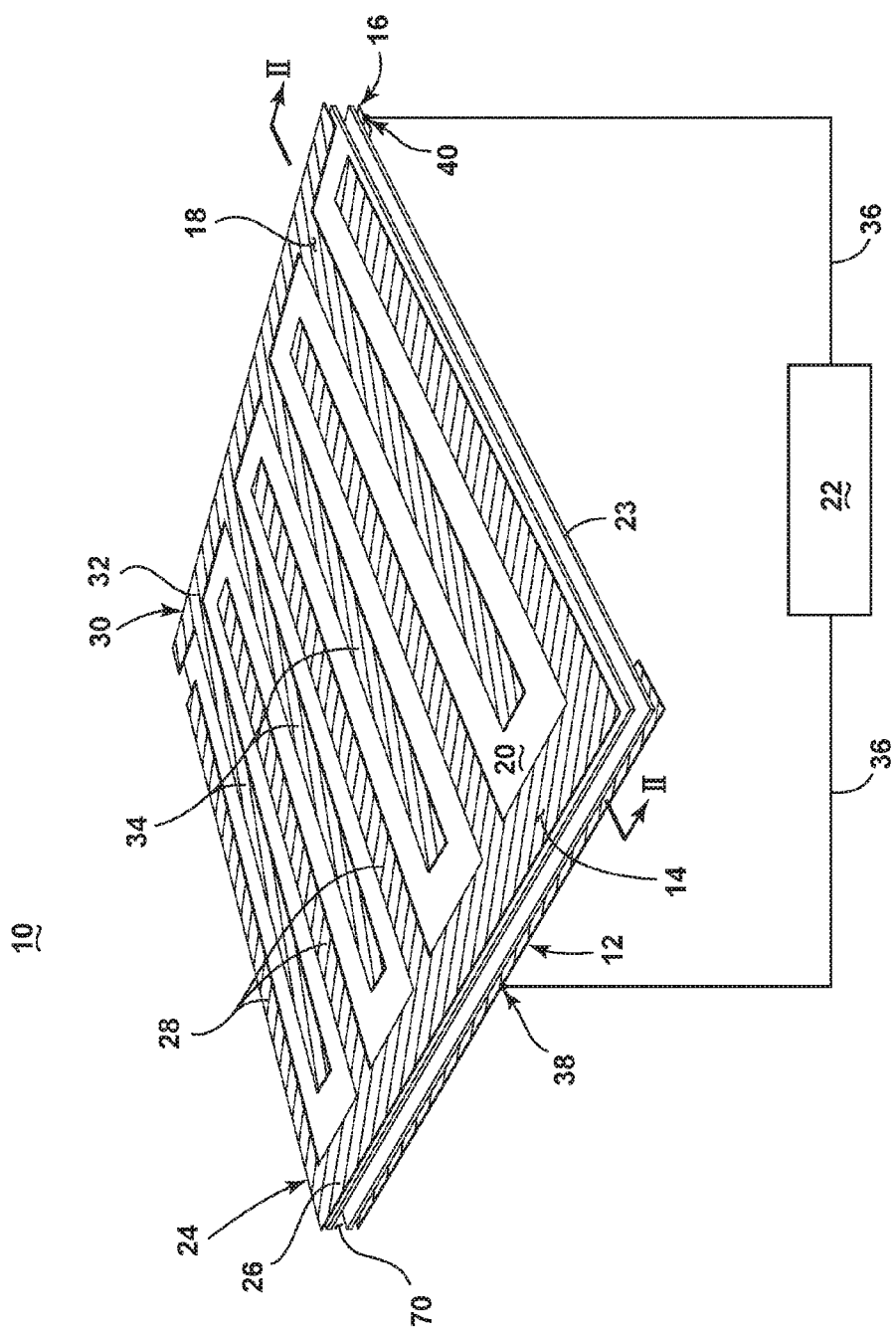
FIG. 1 is a schematic perspective view of the laundry drying apparatus in accordance with the first embodiment of the invention.

FIG. 1 is a schematic illustration of an exemplary laundry drying applicator 10 according to the first embodiment of the invention for dehydrating one or more articles, such as articles of clothing, which may be used in combination with the e-field detection apparatus 2 (not shown). While "laundry" will be used to describe embodiments of the applicator, it is envisioned the embodiments are equally applicable to any textile material. As illustrated in FIG. 1, the laundry drying appliance or applicator 10 has a structure that includes conductive elements, such as a first cathode element 12 and a second cathode element 14, and an opposing first anode element 16, a second anode element 18, in addition to a first non-conductive laundry support element 20, an optional second non-conductive support element 23, and an RF generator 22.

The second cathode element 14 further includes a first comb element 24 having a first base 26 from which extend a first plurality of teeth 28, and the second anode element 18 includes a second comb element 30 having a second base 32 from which extend a second plurality of teeth 34. The second cathode and second anode elements 14, 18 are fixedly mounted to the first supporting element 20 in such a way as to interdigitally arrange the first and second pluralities of teeth 28, 34. The second cathode and second anode elements 14, 18 may be fixedly mounted to the first support element 20 by, for example, adhesion, fastener connections, or laminated layers. Additionally, the first cathode and anode elements 12, 16 are shown fixedly mounted to the second support element 23 by similar mountings. Alternative mounting techniques may be employed.

At least a portion of either the first or second support elements 20, 23 separates an at least partially aligned first cathode and second cathode elements 12, 14. As illustrated, the elongated first cathode element 12 aligns with the substantially rectangular first base 26 portion of the second cathode element 14, through the first support element 20 and second support element 23, with the support elements 20, 23 separated by an optional air gap 70. Similarly shown, the elongated first anode element 16 at least partially aligns with the substantially rectangular second base 32 portion of the second anode element 18 through a portion of the first support element 20 and second support element 23, with the support elements 20, 23 separated by an air gap 70. The aligned portions of the first and second cathode elements 12, 14 are oppositely spaced, on the supporting elements 20, 23, from the aligned portion of the first and second anode elements 16, 18.

The RF generator 22 may be configured to generate a field of electromagnetic radiation (e-field) within the radio frequency spectrum between outputs electrodes and may be electrically coupled between the first cathode element 12 and the first anode element 16 by conductors 36 connected to at least one respective first anode and cathode contact point 38, 40. One such example of an RF signal generated by the RF generator 22 may be 13.56 MHz. The generation of another RF signal, or varying RF signals, is envisioned.

Microwave frequencies are typically applied for cooking food items. However, their high frequency and resulting greater dielectric heating effect make microwave frequencies undesirable for drying laundry articles. Radio frequencies and their corresponding lower dielectric heating effect are typically used for drying of laundry. In contrast with a conventional microwave heating appliance, where microwaves generated by a magnetron are directed into a resonant cavity by a waveguide, the RF generator 22 induces a controlled electromagnetic field between the cathode and anode elements 12, 14, 16, 18. Stray-field or through-field electromagnetic heating provides a relatively deterministic application of power as opposed to conventional microwave heating technologies where the microwave energy is randomly distributed (by way of a stirrer and/or rotation of the load). Consequently, conventional microwave technologies may result in thermal runaway effects or arcing that are not easily mitigated when applied to certain loads (such as metal zippers etc.). Stated another way, using a water analogy where water is analogous to the electromagnetic radiation, a microwave acts as a sprinkler while the above-described RF generator 22 is a wave pool. It is understood that the differences between microwave ovens and RF dryers arise from the differences between the implementation structures of applicator vs. magnetron/waveguide, which renders much of the microwave solutions inapplicable for RF dryers.

Each of the conductive cathode and anode elements 12, 14, 16, 18 remain at least partially spaced from each other by a separating gap, or by non-conductive segments, such as by the first and second support elements 20, 23, or by the optional air gap 70. The support elements 20, 23 may be made of any suitable low loss, fire retardant materials, or at least one layer of insulating materials that isolates the conductive cathode and anode elements 12, 14, 16, 18. The support elements 20, 23 may also provide a rigid structure for the laundry drying applicator 10, or may be further supported by secondary structural elements, such as a frame or truss system. The air gap 70 may provide enough separation to prevent arcing or other unintentional conduction, based on the electrical characteristics of the laundry drying applicator 10. Alternative embodiments are envisioned wherein the RF generator 22 is directly coupled to the respective second cathode and anode elements 14, 18.

Figure 2:
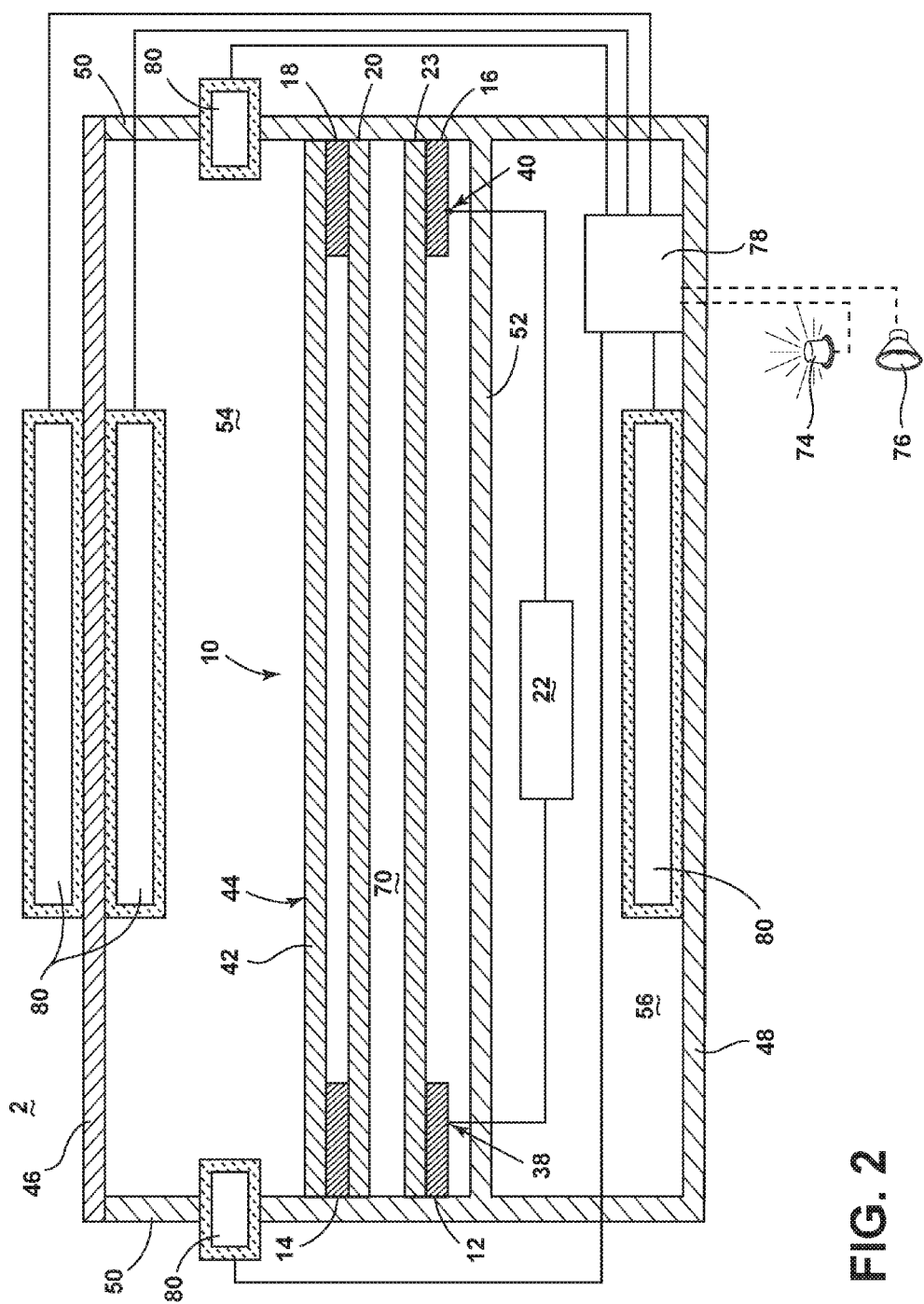
FIG. 2 is a partial sectional view taken along line II-II of FIG. 1 in accordance with the first embodiment of the invention.

Turning now to the partial sectional view of FIG. 2, taken along line II-II of FIG. 1 in accordance with the first embodiment of the invention, the first support element 20 of the laundry drying applicator 10 may further include a non-conductive bed 42 wherein the bed 42 may be positioned above the interdigitally arranged pluralities of teeth 28, 34 (not shown in FIG. 2). The bed 42 further includes a substantially smooth and flat upper surface 44 for receiving wet laundry. The bed 42 may be made of any suitable low loss, fire retardant materials that isolate the conductive elements from the articles to be dehydrated.

The e-field detection apparatus 2 is shown in association with a housing for the laundry drying applicator 10, and includes a top wall 46, a bottom wall 48, and two sidewalls 50. The housing further includes a dividing wall 52, which separates a first space 54, defined by the top wall 46, dividing wall 52, and two side walls 50, from a second space 56 defined by the bottom wall 48, dividing wall 52, and two side walls 50. The laundry drying applicator 10 may be removably or fixedly coupled with the housing at any wall 46, 48, 50, 52. As shown, the RF generator 22 portion of the laundry drying applicator 10 is located in the second space 56, while the remainder of the applicator 10 is located in the first space 54. Electrical conductors traverse the dividing wall 52, connecting the RF generator 22 to each of the respective first cathode and first anode contact points 38, 40. Each of the aforementioned walls 46, 48, 50, 52 further includes a lining of faraday cage-type conductors or a mesh of conductors configured to block static and non-static e-fields generated by the laundry drying applicator 10 from passing through said walls 46, 48, 50, 52. Stated another way, the walls 46, 48, 50, 52 define a faraday cage configured to prevent e-field leakage out of, or into, the applicator 10.

The e-field detection apparatus 2 includes at least one electrically conductive element, at least one indicator, shown as an indicator light 74 and an indicator speaker 76, and a controller 78 coupled with the at least one electrically conductive element and the at least one indicator. The at least one electrically conductive element may be any electrically conductive element that reacts to an energized e-field by producing a voltage or current at the electrical leads. One example of an at least one electrically conductive element may be a fluorescent light bulb 80, which will generate a voltage, and may further illuminate, when exposed to an active e-field. The electrically conductive element may be coupled with the controller 78 by a conductor, for instance, a shielded wire, to prevent e-field interference with the coupled signal.

As illustrated, multiple fluorescent light bulbs 80 are placed about the e-field detection apparatus 2, including within the first space 54, within the second space 56, partially inside and partially outside of the first space 54, and outside of the top wall 46. Many other electrically conductive elements may be used in a similar embodiment, including incandescent light bulbs, resistors, etc. Furthermore, while one example of fluorescent light bulb 80 placement is illustrated, it is envisioned that one or more bulbs 80, or an array of bulbs 80, may be placed in any space relative to the e-field detection apparatus 2, wherein the detection of the presence of an energized e-field is desired in the said space.

The controller 78 is configured to control the indicator light 74 and the indicator speaker 76 in response to at least one electrically conductive element reacting to an energized e-field. The indicator light 74 and indicator speaker 76 may serve multiple purposes in this respect. For instance, the controller 78 may signal the indicator light 74 to provide a visual alert by illuminating the light 74, or may signal the indicator speaker 76 to provide an audible alert, in response to normal operation. The controller 78 may also signal the indicator light 74 and/or indicator speaker 76 to provide an alert or warning when abnormal or dangerous operation is registered. Furthermore, there may be an array of indicators, wherein, for example, one portion of the indicators indicates different conditions or different alerts from another portion of indicators. In this example, particular indicators may selectively represent which fluorescent bulb or bulbs 80 in a positioned array of blubs 80 are reacting to an energized e-field. Moreover, it is envisioned that the indicators may provide indication in proportion to the reaction of an energized e-field, or in proportion to the danger of e-field leakage. For instance, the indicator light 74 may illuminate brighter, or blink, or the indicator speaker 76 may increase the volume of an alert, or change the alert message, in response to the intensity of the e-field or danger to a user. Alternate indicators are envisioned, such as a user interface display, or a communications device which may be configured to transmit the signal to a remote display or remote system. Additionally, it is envisioned that the one or more fluorescent bulbs 80 may replace the indicator itself, in instances where the active e-field results in the bulb 80 lighting up.

The aforementioned structure of the laundry drying applicator 10 operates by creating a first capacitive coupling between the first cathode element 12 and the second cathode element 14 separated by at least a portion of the at least one support element 20, 23, a second capacitive coupling between the first anode element 16 and the second anode element 18 separated by at least a portion of the at least one support element 20, 23, and a third capacitive coupling between the pluralities of teeth 28, 34 of the second cathode element 14 and the second anode element 18, at least partially spaced from each other. During drying operations, wet laundry to be dried may be placed on the upper surface 44 of the bed 42. During, for instance, a predetermined cycle of operation, the RF generator 22 may be continuously or intermittently energized to generate an e-field in the first space 54 between the first, second, and third capacitive couplings which interacts with liquid in the laundry. The liquid residing within the e-field will be dielectrically heated to effect a drying of the laundry.

During drying operations, the fluorescent bulbs 80 may be reacting to an active e-field, if the e-field is present in the same space as the bulbs 80. For instance, the bulb or bulbs 80 within the first space 54, or partially within the first space 54 will react to the energized e-field by generating a voltage at the bulb 80 leads. The fluorescent bulb or bulbs 80 outside of the first space 54 will not generate a voltage at the bulb 80 leads under normal operating conditions because the faraday cage walls 46, 48, 50, 52 will prevent the e-field from leaking to external spaces. However, in instances where the faraday cage walls 46, 48, 50, 52 may break down or fail, e-fields leaked out of the first space 54 may generate a voltage at the fluorescent bulb 80 leads outside of the first space 54.

The controller 78 may be configured to actively or passively detect a signal from the fluorescent bulb or bulbs 80 indicative of a value of a parameter associated with current flow in the bulb 80, such as voltage or current signals. When a voltage is detected, the controller 78 may determine if e-field detection at that fluorescent bulb 80 is expected. For example, if the controller detects voltage from a fluorescent bulb 80 in the first space 54, the controller 78 may compare the detected value to a threshold value, and if the value exceeds the threshold, determine that an energized e-field occupies the space where the bulb 80 is located, and send a signal to the at least one indicator that the bulb 80 is reacting to an energized e-field as expected. In another example, if the controller 78 detects any amount of voltage from a fluorescent bulb 80 outside of the first space 54, the controller 78 may send a signal to the at least one indicator that a bulb 80 is reacting to an energized e-field, which is not expected.

The controller 78 may be able to distinguish between a dangerous e-field condition to a user and an unexpected, but non-dangerous, condition for a user. For instance, an e-field leakage from the first space 54 to the second space 56 may be unexpected and detrimental to the operation of the laundry drying applicator 10 or e-field detection apparatus 2, but the positioning of the sidewalls 50 and the bottom wall 48 may still prevent external e-field leakage. It is also envisioned that the controller 78 may also be configured to compare detected voltages from the array of fluorescent bulbs 80 to perform some indication. For example, the comparison of detected voltages may allow the controller 78 to identify where e-field leakage is taking place. Furthermore, the controller 78 may be configured to stop operation of the laundry drying applicator 10 when sufficient voltage is detected, voltage is detected in an unexpected space, or a dangerous condition for a user is detected.

Many other possible configurations in addition to that shown in the above figures are contemplated by the present embodiment. For example, the RF generator 22 may be directly connected to the respective second cathode and anode elements 114, 118. In another configuration, one embodiment of the invention contemplates different geometric shapes for the laundry drying applicator 10, such as substantially longer, rectangular applicator 10 where the cathode and anode elements 12, 14, 16, 18 are elongated along the length of the applicator 10, or the longer applicator 10 includes a plurality of cathode and anode element 12, 14, 16, 18 sets. In such a configuration, the upper surface 44 of the bed 42 may be smooth and slightly sloped to allow for the movement of wet laundry or water across the laundry drying applicator 10, wherein the one or more cathode and anode element 12, 14, 16, 18 sets may be energized individually or in combination by one or more RF generators 22 to dry the laundry as it traverses the applicator 10. Alternatively, the bed 42 may be mechanically configured to move across the elongated laundry drying applicator 10 in a conveyor belt operation, wherein the one or more cathode and anode element 12, 14, 16, 18 sets may be energized individually or in combination by one or more RF generators 22 to dry the laundry as it traverses the applicator 10.

Additionally, a configuration is envisioned wherein only a single support element 20 separates the first cathode and anode elements 12, 16 from their respective second cathode and anode elements 14, 18. This configuration may or may not include the optional air gap 70. In another embodiment, the first cathode element 12, first anode element 16, or both elements 12, 16 may be positioned on the opposing side of the second support element 23, within the air gap 70. In this embodiment, the air gap 70 may still separate the elements 12, 16 from the first support element 20, or the elements 12, 16 may be in communication with the first support element 20.

Figure 3:
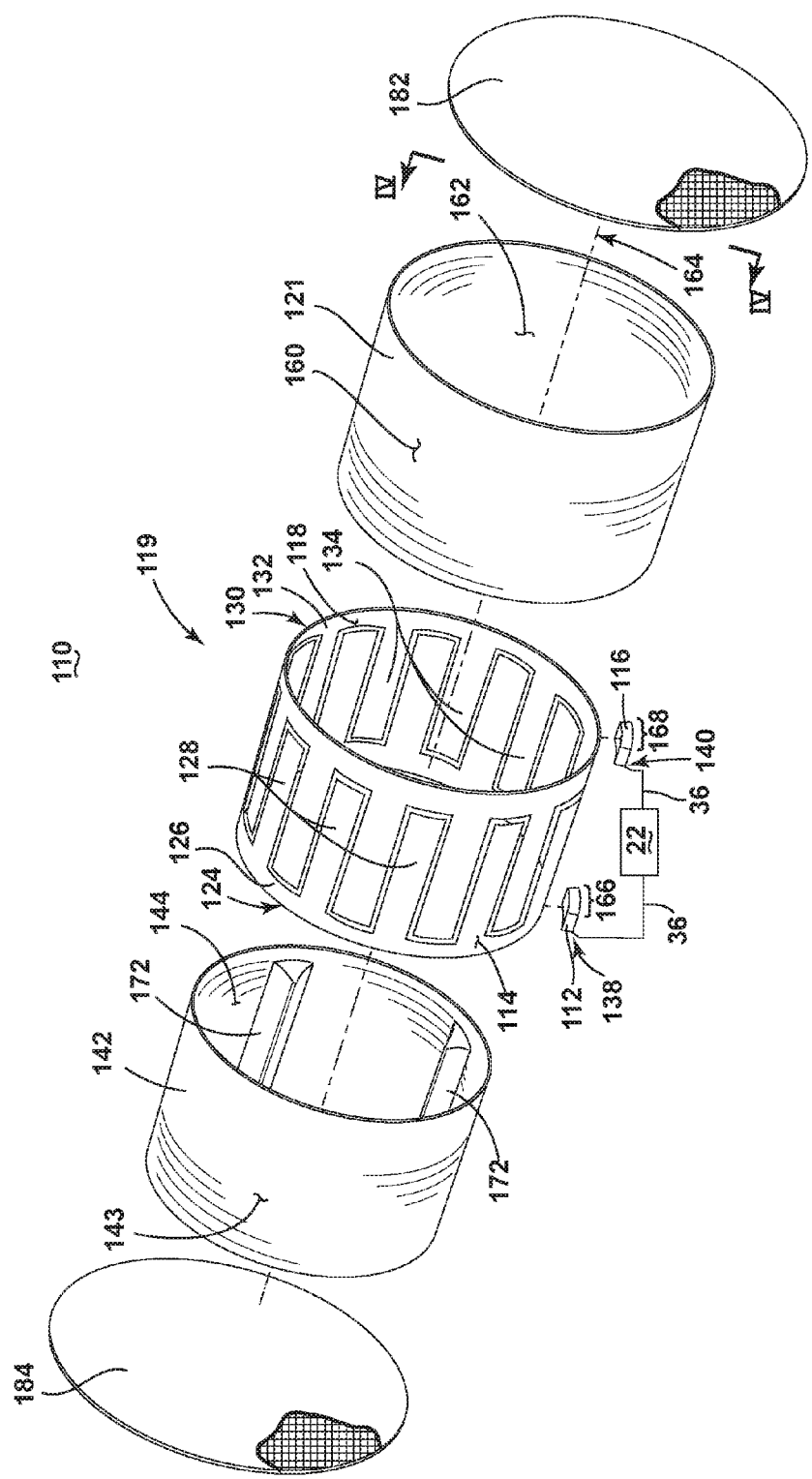
FIG. 3 is a schematic perspective view of an axially-exploded laundry drying apparatus with a rotating drum configuration, in accordance with the second embodiment of the invention.

Furthermore, FIG. 3 illustrates an alternative laundry drying applicator 110 according to a second embodiment of the invention. The second embodiment may be similar to the first embodiment; therefore, like parts will be identified with like numerals increased by 100, with it being understood that the description of the like parts of the first embodiment applies to the second embodiment, unless otherwise noted. A difference between the first embodiment and the second embodiment may be that laundry drying applicator 110 may be arranged in a drum-shaped configuration rotatable about a rotational axis 164, instead of the substantially flat configuration of the first embodiment.

In this embodiment, the support element includes a drum 119 having a non-conducting outer drum 121 having an outer surface 160 and an inner surface 162, a front plate 182 and a back plate 184 wherein the plates 182, 184 are axially spaced from each other and terminate the cavity of the drum on each end, and may further include a non-conductive element, such as a sleeve 142. Each of the front plate 182, and back plate 184 are shown, via cut-away, further include a lining of faraday cage-type conductors or a mesh of conductors configured to block static and non-static e-fields generated by the laundry drying applicator 110 from passing through said plates 182, 184, and are sized to be radially larger than the drum 119. The front plate 182 may be removably configured, for instance, as part of a hinged door, such that it may open to allow access to the cavity of the drum 119.

The sleeve 142 further includes an inner surface 144 for receiving and supporting wet laundry. The inner surface 144 of the sleeve 142 may further include optional tumble elements 172, for example, baffles, to enable or prevent movement of laundry. The sleeve 142 and outer drum 121 may be made of any suitable low loss, fire retardant materials that isolate the conductive elements from the articles to be dehydrated. While a sleeve 142 is illustrated, other non-conductive elements are envisioned, such as one or more segments of non-conductive elements, or alternate geometric shapes of non-conductive elements.

As illustrated, the conductive second cathode element 114, and the second anode elements 118 are similarly arranged in a drum configuration and fixedly mounted to the outer surface 143 of the sleeve 142. In this embodiment, the opposing first and second comb elements 124, 130 include respective first and second bases 126, 132 encircling the rotational axis 164, and respective first and second pluralities of teeth 128, 134, interdigitally arranged about the rotational axis 164.

The laundry drying applicator 110 further includes a conductive first cathode element comprising at least a partial cathode ring 112 encircling a first radial segment 166 of the drum 119 and an axially spaced opposing conductive first anode element comprising at least a partial anode ring 116 encircling a second radial segment 168 of the drum 119, which may be different from the first radial segment 166. As shown, at least a portion of the drum 119 separates the at least partially axially-aligned cathode ring 112 and the first base 126 portion of the second cathode elements 114. Similarly, at least a portion of the drum 119 separates the at least partially axially-aligned anode ring 116 and the second base 132 portion of the second anode element 118. Additionally, this configuration aligns the first base 126 with the first radial segment 166, and the second base 132 with the second radial segment 168. Alternate configurations are envisioned where only at least a portion of the drum 119 separates the cathode or anode rings 112, 116 from their respective first and second bases 126, 132.

The RF generator 22 may be configured to generate a field of electromagnetic radiation (e-field) within the radio frequency spectrum between outputs electrodes and may be electrically coupled between the cathode ring 112 and the anode ring 116 by conductors 36 connected to at least one respective cathode and anode ring contact point 138, 140.

Each of the conductive cathode and anode elements 112, 114, 116, 118 remain at least partially spaced from each other by a separating gap, or by non-conductive segments, such as by the outer drum 121. The outer drum 121 may be made of any suitable low loss, fire retardant materials, or at least one layer of insulating materials that isolates the conductive cathode and anode elements 112, 114, 116, 118. The drum 119 may also provide a rigid structure for the laundry drying applicator 110, or may be further supported by secondary structural elements, such as a frame or truss system.

Figure 4:
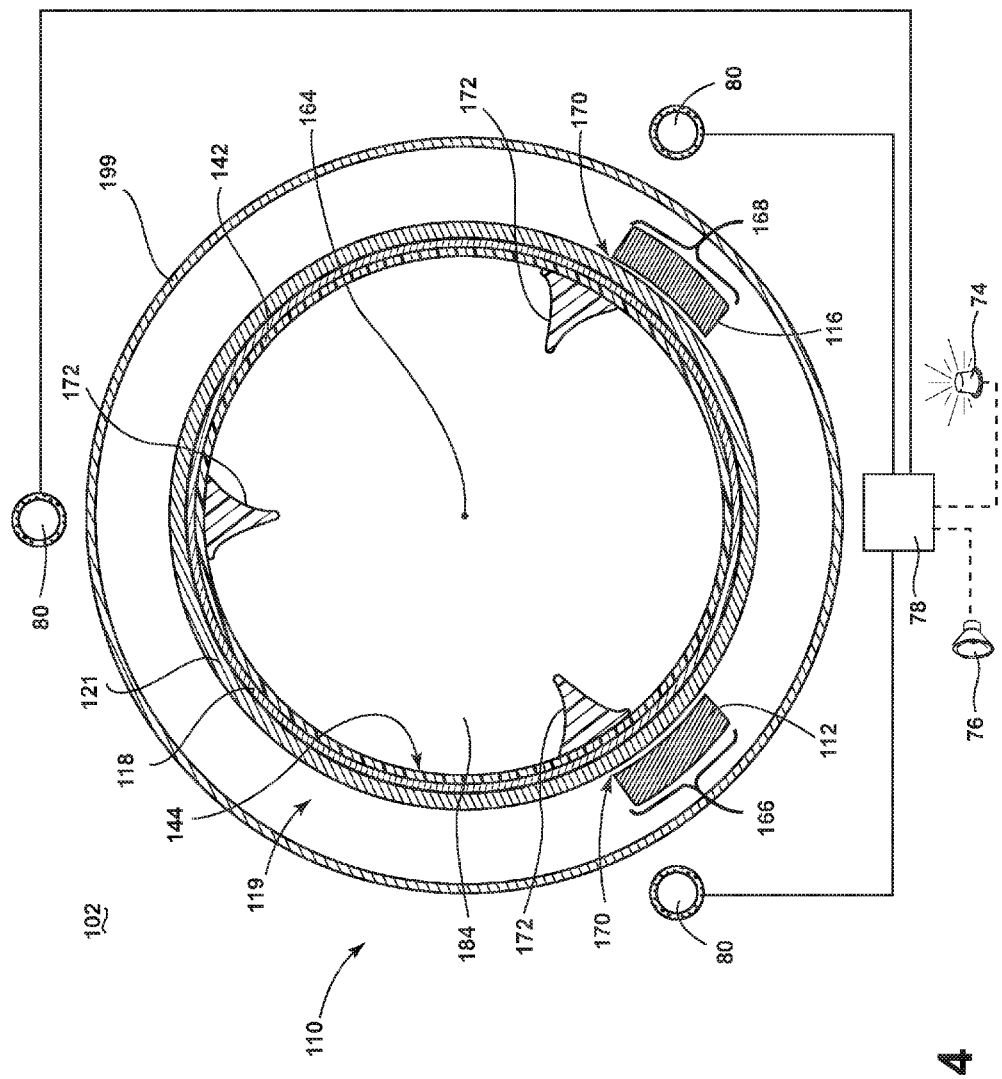
FIG. 4 is a partial sectional view taken along line IV-IV of FIG. 3 showing the assembled configuration of the drum and anode/cathode elements, in accordance with the second embodiment of the invention.

As shown in FIG. 4, the assembled laundry drying applicator 110 of the e-field detection apparatus 102, according to the second embodiment of the invention, creates a substantially radial integration between the sleeve 142, second cathode and anode elements 114, 118 (cathode element not shown), and drum 119 elements. The e-field detection apparatus 102 further includes an additional faraday sleeve 199, radially spaced from and axially enclosing the drum 119 elements. The faraday sleeve 199 is likewise includes a lining of faraday cage-type conductors or a mesh of conductors configured to block static and non-static e-fields generated by the laundry drying applicator 110 from passing radially through the sleeve 199 walls. The faraday sleeve 199 is radially sized to couple with the front and back plates 182, 184, such that the sleeve and plates 199, 182, 184 define a faraday cage configured to prevent e-field leakage out of, or into the laundry drying applicator 110. The radial sleeve 199 is spaced from the cathode and anode elements 114, 118 to prevent unwanted losses between the elements 114, 118 and the sleeve 199.

As further illustrated, the fluorescent bulbs 80 are spaced outside of the faraday cage-lined components 199, 182, 184, and thus, will react to an energized e-field located outside of the components 199, 182, 184. It may be envisioned that additional layers may be interleaved between the illustrated elements. Additionally, while the cathode ring 112 and anode ring 116 are shown offset about the rotational axis for illustrative purposes, alternate placement of each ring 112, 116 may be envisioned. Furthermore, it is envisioned that fluorescent bulbs 80 may be positioned in alternative locations, for instance, inside the drum 119, or partially inside and partially outside the drum 119.

The laundry drying applicator 110 in the second embodiment of the e-field detection apparatus 102 operates by creating a first capacitive coupling between the cathode ring 112 and the second cathode element 114 separated by at least a portion of the drum 119, a second capacitive coupling between the anode ring 116 and the second anode element 118 separated by at least a portion of the drum 119, and a third capacitive coupling between the pluralities of teeth 128, 134 of the second cathode element 114 and the second anode element 118, at least partially spaced from each other.

During drying operations, wet laundry to be dried may be placed on the inner surface 144 of the sleeve 142. During a cycle of operation, the drum 119 may rotate about the rotational axis 164 at a speed at which the tumble elements 172 may enable, for example, a folding or sliding motion of the laundry articles. During rotation, the RF generator 22 may be off, or may be continuously or intermittently energized to generate an e-field between the first, second, and third capacitive couplings which interacts with liquid in the laundry. The liquid interacting with the e-field located within the inner surface 144 will be dielectrically heated to effect a drying of the laundry.

Operation of the e-field detection apparatus 102 is substantially similar to the operation described in the first embodiment.

Many other possible configurations in addition to that shown in the above figures are contemplated by the present embodiment. For example, in another configuration, the cathode and anode rings 112, 116 may encircle larger or smaller radial segments, or may completely encircle the drum 119 at first and second radial segments 166, 168, as opposed to just partially encircling the drum 119 at a first and second radial segments 166, 168. In yet another configuration, the first and second bases 126 and 132 and the first and second plurality of teeth 128, 134 may only partially encircle the drum 119 as opposed to completely encircling the drum 119. In even another configuration, the pluralities of teeth 28, 34, 128, 134 may be supported by slotted depressions in the support element 20 or sleeve 142 matching the teeth 28, 34, 128, 134 for improved dielectric, heating, or manufacturing characteristics of the applicator. In another configuration, the second cathode and anode elements 114, 118 may only partially extend along the outer surface 143 of the sleeve 142. In yet another configuration, the RF generator 22 may directly connect to the respective second cathode and anode elements 114, 116. Furthermore alternative placement of the fluorescent bulbs 80 and an alternative number of bulbs 80 is envisioned.

Figure 5:
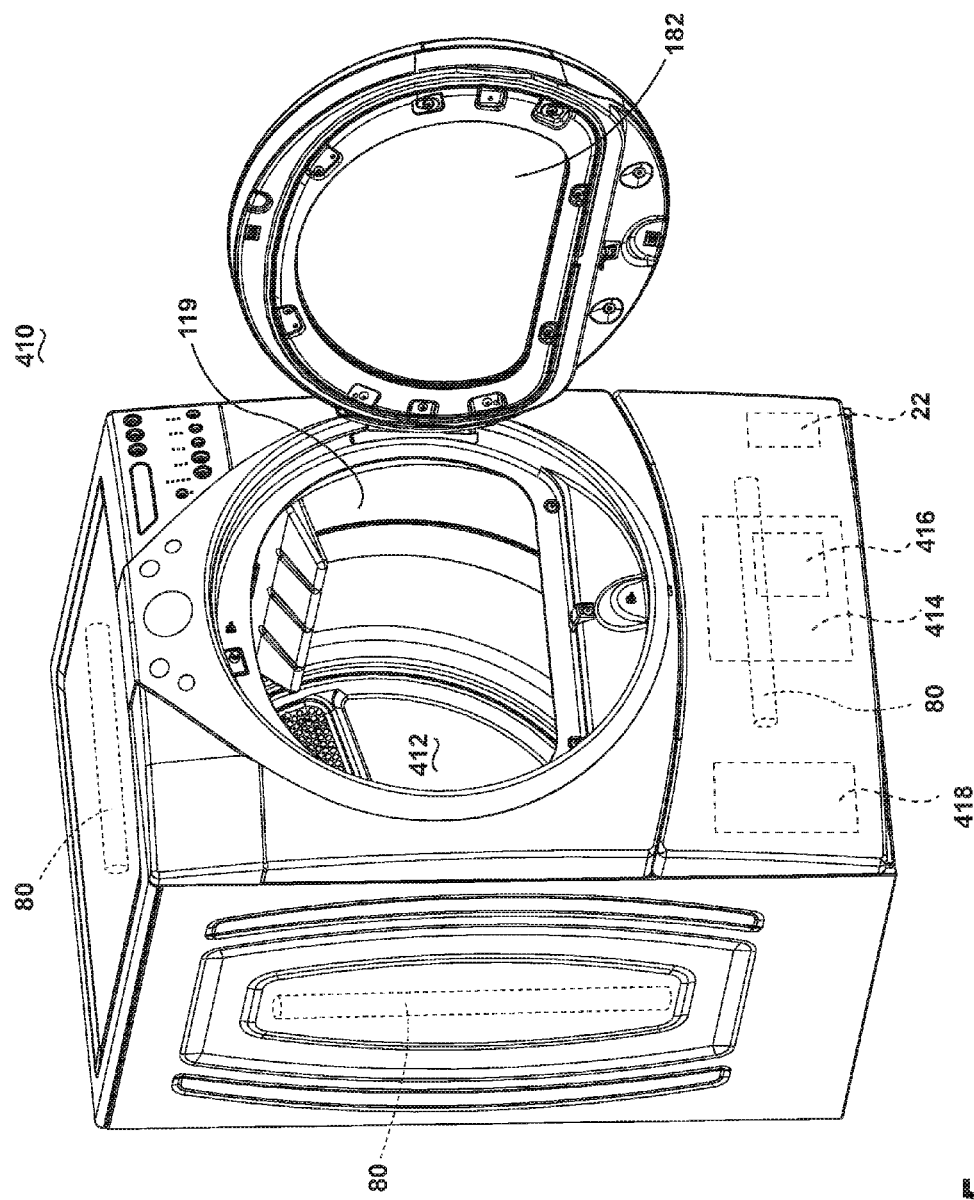
FIG. 5 is a schematic perspective view of an embodiment where the laundry drying appliance is shown as a clothes dryer incorporating the drum of the second, third, and fourth embodiments.

FIG. 5 illustrates an embodiment wherein the e-field detection apparatus 2 may be incorporated into a laundry drying appliance to detect for e-field leakage. The laundry drying appliance, shown as a clothes dryer 410, incorporates the drum 119, which defines a drying chamber 412 for receiving laundry for treatment, such as drying, wherein the e-field will be generated. The clothes dryer comprises an air system 414 supplying and exhausting air from the drying chamber 412, which includes a blower 416. A heating system 418 is provided for hybrid heating the air supplied by the air system 414, such that the heated air may be used in addition to the dielectric heating. The heating system 418 may work in cooperation with the laundry drying applicator 110, as described herein. Also illustrated are examples of where fluorescent bulbs 80 may be located inside or outside of the dryer 410 to create an array to detect for e-field leakage outside of the drying chamber 412. Alternative placements of the fluorescent bulbs 80 are envisioned.

Figure 6:
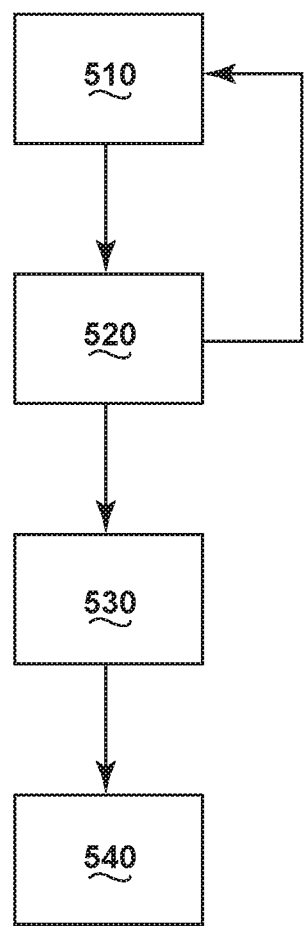
FIG. 6 is a flow chart illustrating a method for detecting the presence of an energized e-field in a space according to an embodiment of the invention.

FIG. 6 shows a flow chart illustrating a method 500 of detecting the presence of an e-field according to an embodiment of the invention. The method 500 begins with a receiving step 510, wherein the controller 78 receives a signal from the at least one electrically conductive element, such as a fluorescent bulb 80, indicative of a value of a parameter associated with current flow or voltage in the bulb 80. Next, in a comparing step 520, the controller 78 compares the parameter value to a threshold value. The threshold value may be zero, such that any parameter value registered will satisfy the comparison, or it may be a non-zero value. If the comparison of the parameter value to the threshold value satisfies the comparison, the method 500 continues to a determining step 530. If the comparison of the parameter value to the threshold value does not satisfy the comparison, the method 500 returns to the receiving step 510 and the method 500 resets.

In the determining step 530, the method 500 and/or the controller 78 determines that an energized e-field occupies the space. The determining step 530 may further determine a signal representative of which space or spaces contains an energized e-field, how intense or strong the e-field is that energizes the space, and to what extent indication of the energized e-field is necessary. Examples of the extent for which an indication of the energized e-field is necessary may include a determination of which alerts are needed, such as color, audible signal, visual signal, etc., and the intensity of the alerts, such as volume, blinking or brightness, etc. Finally, the method 500 continues to an indicating step 540, wherein the signal from the determining step 530 is sent from the controller 78 to the chosen indicators to provide the intended determination, including the presence of an energized e-field in the space, and/or the intensity of the e-field and the like. After the indicating step 540, further steps may take place, for example, affecting the operating of the laundry drying applicator 10. Additionally, after the indicating step 540, the method 500 may return to the receiving step 510 after the completion of the indicating step 540, or the method 500 may complete.

Many other possible embodiments and configurations in addition to those shown in the above figures are contemplated by the present disclosure. For example, alternate geometric configurations of the first and second pluralities of teeth are envisioned wherein the interleaving of the teeth are designed to provide optimal electromagnetic coupling while keeping their physical size to a minimum. Additionally, the spacing between the pluralities of teeth may be larger or smaller than illustrated.

The embodiments disclosed herein provide an e-field detection apparatus for detecting the presence of an energized e-field in a space. One advantage that may be realized from in the above described embodiments is that off-the-shelf components, such as bulbs or resistors, can be used to replace expensive, well filtered, and attenuated sensors used to measure active e-fields in a system. This replacement reduces costs, as well as reduces the time and effort in calibration and maintenance of the alternate sensors. Additionally, because of the reduced costs, arrays of bulbs can be used to ensure a robust detection apparatus, making it less likely any e-field generating system will malfunction without indication.

Another advantage of the above described embodiments is that the e-field detection apparatus can be used to detect both external e-field leakage, which may be a danger to a user, and internal e-field leakage, wherein additional electronics, sensors, and wires that operate different systems may be adversely affected by any unanticipated or undiscovered e-fields. Thus, the apparatus advantageously maintains the integrity of other electronic systems as well. Yet another advantage of the above described embodiments is that the bulbs can be shaped, sized, and installed in compact locations. A further advantage of the above described embodiments is that the e-field detection apparatus not only detects an active e-field, but may alert a system or a user to the detection. Warning lights, alarms, automatic shutoff of the e-field generation, and the like, increase the safety of operation. Additionally, the fluorescent bulbs, themselves, may illuminate in reaction to the e-field, producing an indication of an active e-field without the need for separate alert or alarm.

Yet another advantage of the above described embodiments is that the e-field detection apparatus may be configured to provide the user primary or ambient lighting due to the reaction of the fluorescent bulbs in the e-field. Additionally, redundant systems may be configured to operate with the e-field detection apparatus such that RF leakage or e-field interference which may interfere with a primary controller may still be identified by secondary or tertiary controllers, alternatively located such that they may not subject to the same e-field interference.

A further advantage that may be realized in the above embodiments may be that the above described embodiments are able to dry articles of clothing during rotational or stationary activity, allowing the most efficient e-field to be applied to the clothing for particular cycles or clothing characteristics. A further advantage of the above embodiments may be that the above embodiments allow for selective energizing of the RF generator according to such additional design considerations as efficiency or power consumption during operation.

Additionally, the design of the anode and cathode may be controlled to allow for individual energizing of particular RF generators in a single or multi-generator embodiment. The effect of individual energization of particular RF generators results in avoiding anode/cathode pairs that would result in no additional material drying (if energized), reducing the unwanted impedance of additional anode/cathode pairs and electromagnetic fields inside the drum, and an overall reduction to energy costs of a drying cycle of operation due to increased efficiencies. Finally, reducing unwanted fields will help reduce undesirable coupling of energy into isolation materials between capacitive coupled regions.

Moreover, the capacitive couplings in embodiments of the invention allow the drying operations to move or rotate freely without the need for physical connections between the RF generator and the pluralities of teeth. Due to the lack of physical connections, there will be fewer mechanical couplings to moving or rotating embodiments of the invention, and thus, an increased reliability appliance.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for detecting a presence of an energized e-field in a space for heating an article, wherein the space includes an article to be heated and at least one electrically conductive element configured to produce a voltage or current in reaction to an energized e-field in the space and coupled with a controller, the method comprising:
   if the at least one electrically conductive element produces a voltage or current in reaction to the e-field apart from the article, receiving in the controller a signal from the at least one electrically conductive element indicative of a value of a parameter associated with voltage or current flow in the at least one electrically conductive element;
   determining that the energized e-field occupies the space based on the received signal; and
   sending a signal from the controller indicative of the presence of the energized e-field in the space.

2. The method of claim 1 wherein sending the signal from the controller relates to the intensity of the voltage or current produced by the at least one electrically conductive element.

3. The method of claim 1 wherein the electrically conductive element comprises at least one light bulb.

4. The method of claim 3 wherein the light bulb further comprises at least one of an incandescent bulb or a fluorescent bulb.

5. The method of claim 1 wherein the at least one electrically conductive element comprises an array of electrically conductive elements.

6. The method of claim 1 wherein the parameter includes at least one of voltage or current.

7. The method of claim 5 wherein the signal is further indicative of which at least one electrically conductive element in the array of electrically conductive elements is in an energized e-field in the space.

8. The method of claim 1, wherein the e-field is energized by a Radio Frequency (RF) generator.

9. The method of claim 8, wherein the e-field is energized in a faraday cage defining an inside space and an outside space, and which is configured to prevent e-field leakage from the inside space to the outside space.

10. The method of claim 9 wherein the at least one electrically conductive element is positioned in at least one of the inside space or the outside space.

11. The method of claim 9 wherein the signal indicates e-field leakage from the inside space.

12. The method of claim 11 wherein the signal indicative of e-field leakage is proportional to an amount of e-field leakage.

13. The method of claim 1 wherein the signal is represented by at least one of an audible alert, a visual alert, or a warning alert.

14. The method of claim 13 wherein the at least one alert is proportional to the signal.

15. The method of claim 14 wherein the audible alert indicates a proportional presence of the e-field by at least one of increasing a volume of the audible alert or changing an audible alert message.

16. The method of claim 14 wherein the visual alert indicates a proportional presence of the e-field by at least one of illuminating brighter, altering a visible color, altering a blinking pattern.

17. The method of claim 1, further comprising, upon determining that the energized e-field occupies the space, determining an indication of the current cycle of operation, and sending the signal from the controller indicative of the current cycle of operation.

18. The method of claim 1, further comprising, upon determining that the energized e-field occupies the space, determining an efficiency of the current cycle of operation, and altering the energizing of the e-field based on the determined efficiency.

19. A method for detecting a presence of an energized e-field in a space for heating an article, the e-field generated by an anode element and a cathode element, wherein the space includes an article to be heated and at least one electrically conductive element separate from the anode and cathode elements and configured to produce a voltage or current in reaction to an energized e-field in the space and coupled with a controller, the method comprising:
   if the at least one electrically conductive element produces a voltage or current in reaction to the e-field apart from the article, receiving in the controller a signal from the at least one electrically conductive element indicative of a value of a parameter associated with voltage or current flow in the at least one electrically conductive element;
   determining that the energized e-field occupies the space based on the received signal; and
   sending a signal from the controller indicative of the presence of the energized e-field in the space.

20. A method for detecting a presence of an energized e-field in a space for heating an article, wherein the space includes an article to be heated and at least one electrically conductive element configured to produce a voltage or current in reaction to an energized e-field in the space and coupled with a controller, the method comprising:

if the at least one electrically conductive element produces a voltage or current in reaction to the e-field apart from the article, receiving in the controller a signal from the at least one electrically conductive element indicative of a value of a parameter associated with voltage or current flow in the at least one electrically conductive element;

determining that the energized e-field occupies the space based on the received signal;

sending a signal from the controller indicative of the presence of the energized e-field in the space; and generating a visual alert, by the controller, wherein the visual alert indicates a proportional presence of the e-field by at least one of illuminating brighter, altering a visible color, altering a blinking pattern.

* * * * *